United States Patent
Lavanga et al.

(10) Patent No.: US 10,204,995 B2
(45) Date of Patent: Feb. 12, 2019

(54) NORMALLY OFF HEMT WITH SELF ALIGNED GATE STRUCTURE

(71) Applicant: Infineon Technologies Austria AG, Villach (AT)

(72) Inventors: Simone Lavanga, Faak am See (AT); Marco Silvestri, Bodensdorf (AT); Gilberto Curatola, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/361,610

(22) Filed: Nov. 28, 2016

(65) Prior Publication Data
US 2018/0151681 A1   May 31, 2018

(51) Int. Cl.
| H01L 21/308 | (2006.01) |
| H01L 29/423 | (2006.01) |
| H01L 21/306 | (2006.01) |
| H01L 29/20 | (2006.01) |
| H01L 29/205 | (2006.01) |

(Continued)

(52) U.S. Cl.
CPC ...... *H01L 29/42316* (2013.01); *H01L 21/308* (2013.01); *H01L 21/30621* (2013.01); *H01L 29/1066* (2013.01); *H01L 29/2003* (2013.01); *H01L 29/205* (2013.01); *H01L 29/401* (2013.01); *H01L 29/66462* (2013.01); *H01L 29/7786* (2013.01); *H01L 29/7787* (2013.01)

(58) Field of Classification Search
None
See application file for complete search history.

(56) References Cited

U.S. PATENT DOCUMENTS 6,316,793 B1 * 11/2001 Sheppard ............ H01L 29/1608
257/103
9,728,618 B2 * 8/2017 Minoura ............. H01L 29/4236
(Continued)

OTHER PUBLICATIONS

Okita, Hideyuki et al., "Through Recessed and Regrowth Gate Technology for Realizing Process Stability of GaN-GITs", Proceedings of the 2016 28th International Symposium on Power Semiconductor Devices and ICs (ISPSD), Jun. 12-16, 2016, Prague, Czech Republic, Jun. 2016, pp. 23-26.

(Continued)

*Primary Examiner* — Victoria K Hall
(74) *Attorney, Agent, or Firm* — Murphy, Bilak & Homiller, PLLC (57) ABSTRACT

A heterostructure body with a buffer region, and a barrier region disposed on the buffer region is provided. A gate trench is formed in the barrier region. A layer of doped semiconductor material that fills the gate trench is formed. The doped semiconductor material in the gate trench locally depletes a subjacent section of the two-dimensional charge carrier gas channel at zero bias. A layer of electrically conductive material is formed on the doped semiconductor material. The layer of doped semiconductor material is structured to form a gate structure that includes a narrower portion of the doped semiconductor material that is disposed in the gate trench, a wider portion of the doped semiconductor material that is above the trench, and a gate electrode portion of the electrically conductive material that completely covers the wider portion of the doped semiconductor material.

17 Claims, 12 Drawing Sheets

(51) Int. Cl.
H01L 29/40 (2006.01)
H01L 29/66 (2006.01)
H01L 29/778 (2006.01)
H01L 29/10 (2006.01)

(56) References Cited

U.S. PATENT DOCUMENTS

| | | | | |
|---|---|---|---|---|
| 9,786,775 | B2* | 10/2017 | Tu | H01L 29/7787 |
| 9,818,855 | B2* | 11/2017 | Saito | H01L 29/7786 |
| 9,837,521 | B2* | 12/2017 | Yamamoto | H01L 29/42316 |
| 10,084,052 | B2* | 9/2018 | Tsuchiya | H01L 29/2003 |
| 10,084,078 | B2* | 9/2018 | Nakayama | H01L 29/2003 |
| 10,090,406 | B2* | 10/2018 | Prechtl | H01L 29/0688 |
| 2006/0022266 | A1* | 2/2006 | Messenger | H01L 29/66742 257/347 |
| 2007/0164314 | A1* | 7/2007 | Beach | H01L 29/66462 257/194 |
| 2008/0283870 | A1* | 11/2008 | Sato | H01L 29/42364 257/194 |
| 2011/0248283 | A1* | 10/2011 | Cao | H01L 29/41725 257/76 |
| 2012/0086049 | A1* | 4/2012 | Hwang | H01L 29/66462 257/194 |
| 2012/0138948 | A1* | 6/2012 | Miyajima | H01L 29/4236 257/76 |
| 2012/0280278 | A1* | 11/2012 | Curatola | H01L 29/42316 257/191 |
| 2013/0043485 | A1* | 2/2013 | Ueno | H01L 29/42316 257/76 |
| 2014/0008658 | A1* | 1/2014 | Siemieniec | H01L 29/42372 257/76 |
| 2014/0091316 | A1* | 4/2014 | Kikkawa | H01L 29/66462 257/76 |
| 2014/0097468 | A1 | 4/2014 | Okita et al. | |
| 2014/0103459 | A1 | 4/2014 | Kinoshita et al. | |
| 2016/0049347 | A1 | 2/2016 | Negoro et al. | |
| 2016/0336437 | A1 | 11/2016 | Kajitani et al. | |

OTHER PUBLICATIONS

Marcon, Denis et al., "Direct comparison of GaN-based e-mode architectures (recessed MISHEMT and p-GaN HEMTs) processed on 200mm GaN-on-Si with Au-free technology", Proceedings of SPIE—The International Society for Optical Engineering, vol. 9363, Mar. 2015, 1-12.

* cited by examiner

NORMALLY OFF HEMT WITH SELF ALIGNED GATE STRUCTURE

TECHNICAL FIELD

The instant application generally relates to high electron mobility transistors, and more particularly relates to the formation of gate structures for normally-off high electron mobility transistors.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN. In a GaN/AlGaN based HEMT, a two-dimensional electron gas (2DEG) arises near the interface between the AlGaN barrier layer and the GaN buffer layer. In an HEMT, the 2DEG forms the channel of the device. Similar principles may be utilized to select buffer and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Measures must be taken to prevent the channel region of an HEMT from being in a conductive state in the absence of a positive gate voltage.

Due to the high electron mobility of the two-dimensional carrier gas in the heterojunction configuration, HEMTs offer high conduction and low losses in comparison to many conventional semiconductor transistor designs. These advantageous conduction characteristics make HEMTs desirable in applications including, but not limited to, use as switches in power supplies and power converters, electric cars, air-conditioners, and in consumer electronics, for example. However, normally-on HEMTs have limited applicability in these applications because these devices must be accompanied by circuitry that can generate the negative voltages necessary to turn the device off. Such circuitry adds cost and complexity to the design. Moreover, for safety reasons, it is typically desirable to have a device that is non-conducting in the absence of a gate bias. For this reason, it is typically desirable to include features in an HEMT that modify the intrinsic normally-on configuration and provide a device with a normally-off configuration (i.e., a positive threshold voltage).

One technique for providing a normally-off HEMT involves configuring the gate structure to modify the intrinsic conductive state of the 2DEG. For example, a relatively thick (typically 100 nm or greater) p-type doped GaN material can be formed under the gate electrode. This thick p-type GaN layer depletes the inversion layer under the gate structure, shifting the threshold voltage of the device to positive values. The p-type GaN layer must be thick enough to create a vertical field which depletes and populates the naturally occurring inversion channel underlying the barrier layer, typically a layer of AlGaN. The vertical field generated by a voltage applied to the gate electrode allows for on and off modulation of the inversion layer.

Market competitive devices for high voltage and low voltage applications should ideally provide, among other things, normally-off behavior with a $V_{TH}$ (threshold voltage) of about 1 V (volt), low $R_{DSON}$ (drain-source on-resistance), very low current-collapse, very low dynamic $R_{DSON}$, very low threshold voltage shift, and low parasitic capacitances. The figure of merit (FOM), which is a device parameter that relates $R_{DSON}$ to $Q_{GD}$ (gate charge), is one important parameter that designers seek to improve in furtherance of these goals.

SUMMARY

A method of forming a semiconductor device is provided. According to an embodiment, the method includes providing a heterostructure body with a buffer region, and a barrier region disposed on the buffer region. The barrier region has a different band gap than the buffer region such that a two-dimensional charge carrier gas channel arises near an interface between the buffer region and the barrier region. A gate trench is formed in the barrier region. A layer of doped semiconductor material that fills the gate trench is formed. The doped semiconductor material in the gate trench locally depletes a subjacent section of the two-dimensional charge carrier gas channel at zero bias. A layer of electrically conductive material is formed on the doped semiconductor material. The layer of doped semiconductor material is structured to form a gate structure that is configured to control a conductive state of the two-dimensional charge carrier gas channel. The gate structure includes a narrower portion of the doped semiconductor material that is disposed in the gate trench, a wider portion of the doped semiconductor material that is above the gate trench and laterally extends past outer sidewalls of the gate trench, and a gate electrode portion of the electrically conductive material that completely covers the wider portion of the doped semiconductor material.

According to another embodiment, the method includes providing a heterostructure body with a buffer region, and a barrier region disposed on the buffer region. The barrier region has a different band gap than the buffer region such that a two-dimensional charge carrier gas channel arises near an interface between the buffer region and the barrier region. A gate trench is formed in the barrier region. A layer of doped semiconductor material that fills the gate trench is formed. The doped semiconductor material in the gate trench locally depletes a subjacent section of the two-dimensional charge carrier gas channel at zero bias. A layer of electrically conductive material is formed on the doped semiconductor material. The layer of doped semiconductor material is structured to form a gate structure that is configured to control a conductive state of the two-dimensional charge carrier gas channel. An electrically insulating passivation layer is formed on the barrier region and the gate structure after structuring the layer of doped semiconductor material and the layer of electrically conductive material.

A semiconductor device is disclosed. According to an embodiment, the semiconductor device includes a heterostructure body with a buffer region, and a barrier region disposed on the buffer region. The barrier region has a different band gap than the buffer region such that a two-dimensional charge carrier gas channel arises near an interface between the buffer region and the barrier region. A gate trench is formed in the barrier region. A gate structure is configured to control a conductive state of the two-dimensional charge carrier gas channel. The gate structure includes a narrower portion of doped semiconductor material that is disposed in the gate trench, a wider portion of doped semiconductor material that is above the gate trench and laterally extends past outer sidewalls of the gate trench, and a gate electrode portion of electrically conductive material that completely covers the wider portion of the doped semiconductor material. The doped semiconductor material is configured to locally deplete the two-dimensional charge carrier gas channel at zero bias.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein include forming a gate structure for normally-off HEMT device with a self-aligned technique. According to this technique, a heterostructure body with a barrier and buffer region is provided. A gate trench is formed in the barrier region of the semiconductor body, e.g., by anisotropic etching. The gate trench is filled with a layer of doped semiconductor material (e.g., p-type GaN) that is configured to locally deplete the two-dimensional charge carrier gas channel. An electrically conductive layer (e.g., aluminum) is then deposited on the doped semiconductor layer. A structured mask is formed on the electrically conductive layer and used to structure both the electrically conductive layer and the layer of doped semiconductor material. This structuring produces a gate structure that fills the gate trench and includes a wider portion above the gate trench that slightly overlaps past the sidewalls of the trench. Subsequently, an electrically insulating passivation layer (SiN) is formed on the heterostructure body and over the gate structure. This technique produces a normally-off HEMT device with improved FOM in comparison to prior art devices, due to a reduced $L_{td}$ (lateral extension towards the drain) of the gate structure, and improved current collapse, dynamic $R_{DSON}$, and threshold voltage shift, due to reduced surface damage in the gate region in comparison to prior art devices.

Figure 1:
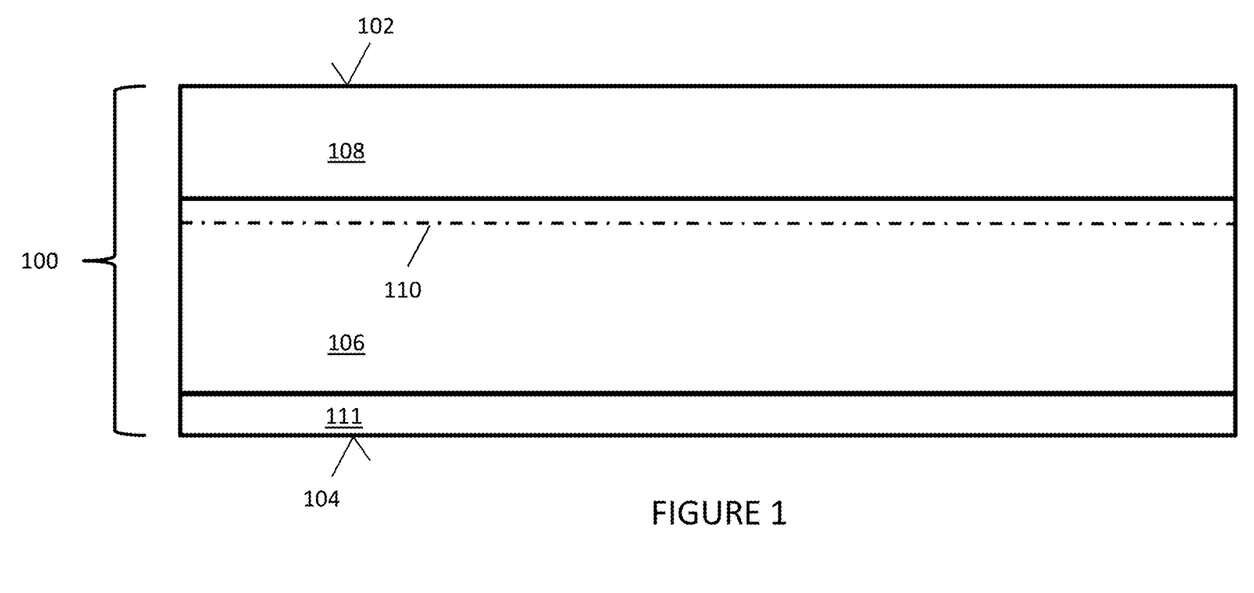
FIG. 1 illustrates a heterostructure body, according to an embodiment.

Referring to FIG. 1, a heterostructure body 100 is provided. The heterostructure body 100 includes a main surface 102 and a rear surface 104 opposite the main surface 102. The heterostructure body 100 includes a buffer region 106 and a barrier region 108 disposed on the buffer region 106. The material of the barrier region 108 has a different bandgap than the material of the buffer region 106 such that a two-dimensional charge carrier gas channel 110 arises near an interface between the buffer region 106 and the barrier region 108. According to an embodiment, the buffer region 106 is a region of GaN (gallium nitride) and the barrier region 108 is a region of AlGaN (aluminum gallium nitride). In that case, the two-dimensional charge carrier gas channel 110 is a 2DEG (two-dimensional charge carrier gas channel).

According to an embodiment, the buffer region 106 and the barrier region 108 of the heterostructure body 100 are epitaxial layers that are formed according to epitaxial growth techniques. According to this process, a base substrate 111 is provided. The base substrate 111 can include any material that is suitable for epitaxial growth thereon. Exemplary materials for the base substrate 111 include silicon and carbon. The base substrate 111 can be provided from a bulk semiconductor substrate or alternatively can be formed using an epitaxy process. After providing the base substrate 111, the buffer region 106 is epitaxially grown on the base region, and the barrier region 108 is epitaxially grown on the buffer region 106. A lattice transition layer (not shown) may be provided between the base substrate 111 and the buffer region 106 to reduce lattice mismatch between the two regions.

Figure 2:
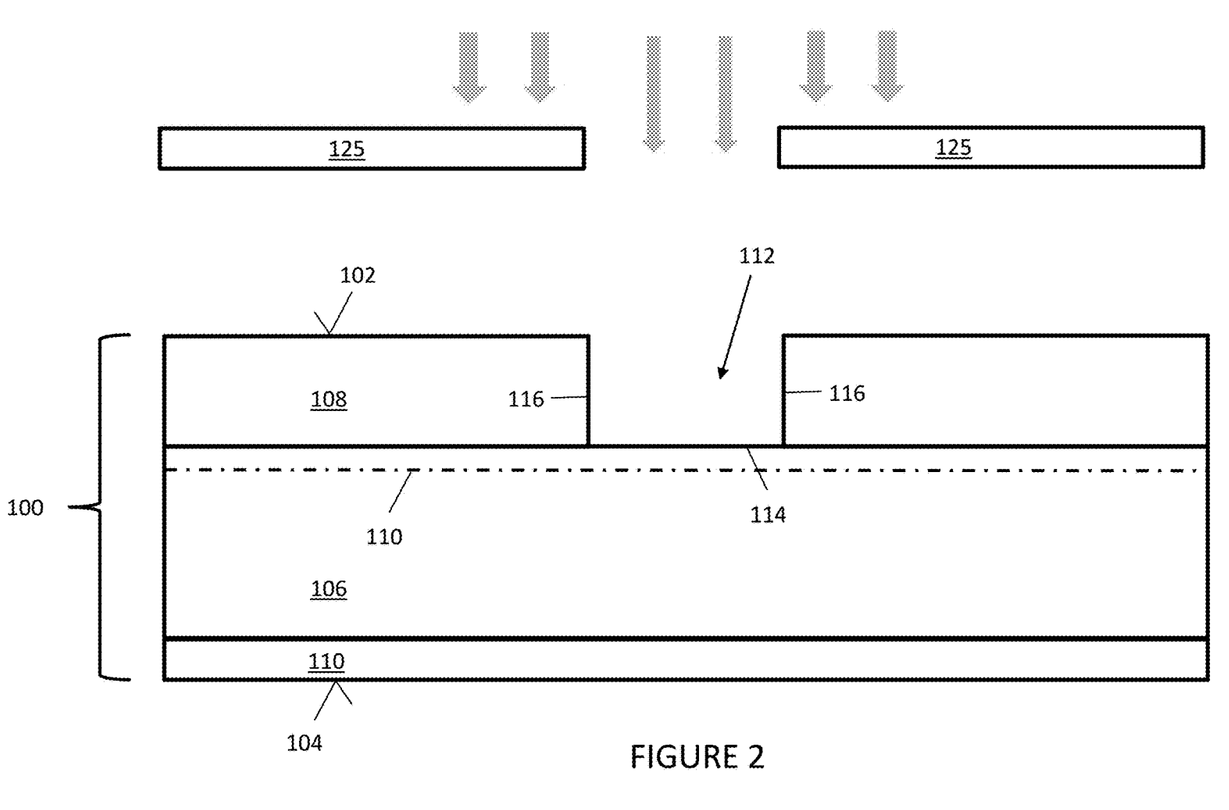
FIG. 2 illustrates forming a gate trench in the heterostructure body, according to an embodiment.

Referring to FIG. 2, a gate trench 112 is formed in the heterostructure body 100. According to an embodiment, the gate trench 112 is formed by etching a section of the barrier region 108 completely away such that the buffer region 106 is exposed at a bottom 114 of the gate trench 112. That is, an entire thickness of the barrier region 108 is removed in a lateral section of the barrier region 108. The gate trench 112 may be formed by an anisotropic plasma etching process that is selective between the different materials of the buffer and barrier regions 106, 108 (e.g., GaN and AlGaN). The gate trench 112 etching process is controlled to stop at or near the interface between the buffer and barrier regions 106, 108. Optionally, the process can be controlled to completely etch through the barrier region 108 and to etch a small depth into the buffer region 106. According to another option, a thin (e.g., 1-2 nm thick) etch stop layer (not shown) of AlN or InAlN, for example, may be provided between the buffer and barrier regions 106, 108. This etch stop layer may be used to stop the gate trench 112 etching process once the barrier region 108 is completely removed. Instead of an anisotropic process, an isotropic process can be used to form the gate trench such that the outer sidewalls 116 are disposed at an inclined angle relative to the main surface 102 of the heterostructure body 100.

Figure 3:
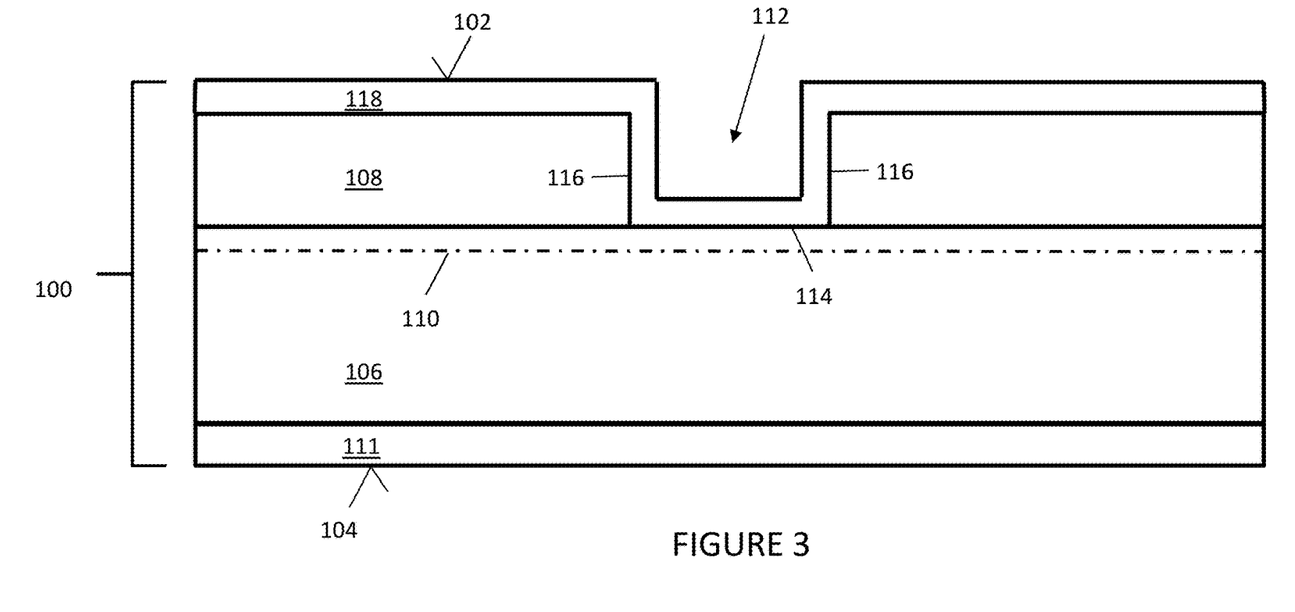
FIG. 3 illustrates forming a barrier layer on the heterostructure body, according to an embodiment.

Referring to FIG. 3, a second barrier layer 118 is formed. The second barrier layer 118 lines the bottom 114 and sidewalls of the gate trench 112. Accordingly, the buffer region 106 is covered by the second barrier layer 118. The second barrier layer 118 can have the same material composition as the barrier region 108. For example, the second barrier layer 118 can be a layer of AlGaN with the same aluminum content as an AlGaN barrier region 108. Alternatively, the second barrier layer 118 can have a different aluminum content as an AlGaN barrier region 108. According to an embodiment, the second barrier layer 118 is formed by an epitaxial growth technique. In this way, the second barrier layer 118 conforms to the outer surface of the barrier region 108 in the depicted manner.

Figure 4:
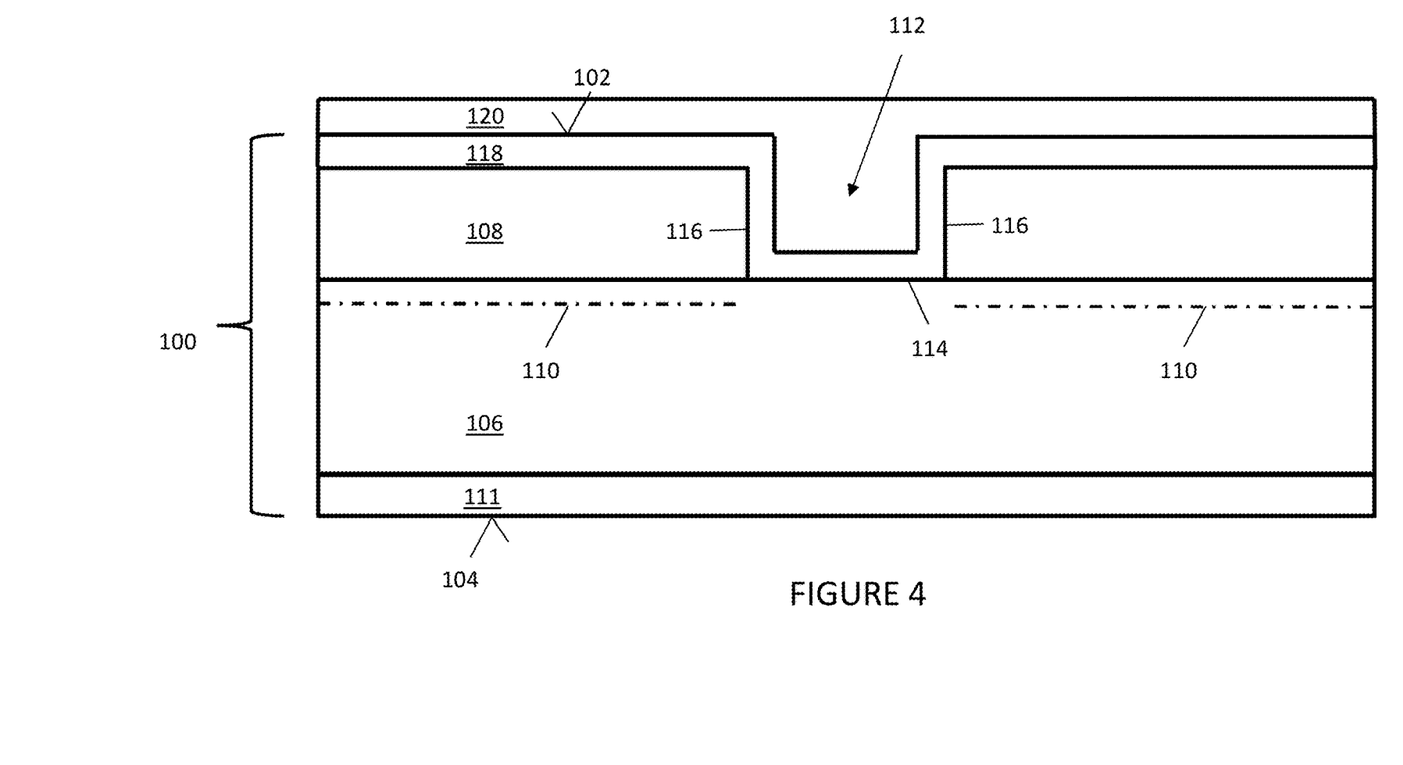
FIG. 4 illustrates forming a doped semiconductor layer that fills the gate trench, according to an embodiment.

Referring to FIG. 4, a layer of doped semiconductor material 120 is formed on the second barrier layer 118. The layer of doped semiconductor material 120 is formed such that the gate trench 112 is filled by the doped semiconductor material. Due to the presence of the second barrier layer 118 in the gate trench 112, the layer of doped semiconductor material 120 is separated from the buffer region 106 by the second barrier layer 118. According to an embodiment, the layer of doped semiconductor material 120 is formed by an epitaxial growth technique. According to this technique, the layer of doped semiconductor material 120 is epitaxially grown on an exposed outer surface of the barrier region 108 that includes the gate trench 112. The epitaxy process can be carried out such that the layer of doped semiconductor material 120 is sufficiently thick to completely fill the gate trench 112 with doped semiconductor material.

The material composition of the layer of doped semiconductor material 120 is selected to deplete the section of the two-dimensional charge carrier gas channel 110 that is subjacent to the gate trench 112 at zero external bias. This can be done by selecting a doping concentration for the doped semiconductor material that generates an electric field sufficient to deplete the two-dimensional charge carrier gas channel 110 in a region that is immediately below the gate trench 112. In the example of a GaN/AlGaN heterostructure body 100, this local depletion can be achieved by forming the layer of doped semiconductor material 120 as a layer of p-type GaN.

Figure 5:
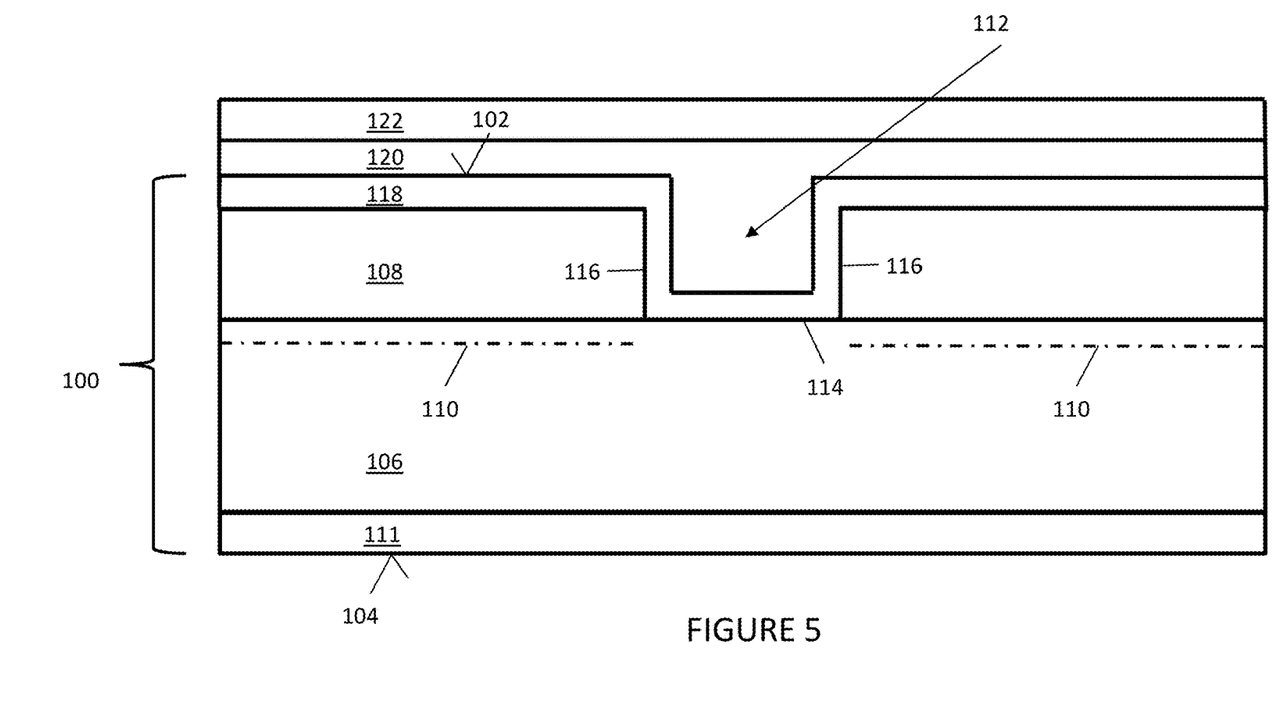
FIG. 5 illustrates forming an electrically conductive layer on the doped semiconductor layer, according to an embodiment.

Referring to FIG. 5, an electrically conductive layer 122 is formed on the layer of doped semiconductor material 120. Generally speaking, the electrically conductive layer 122 can be any electrical conductive metal. Exemplary materials for the electrically conductive layer 122 include Ti, TiN, W, TiW and Mo. The electrically conductive layer 122 can be formed using a deposition technique, such as a physical vapor deposition (PVD) technique in which the electrically conductive material is deposited directly on the layer of doped semiconductor material 120. Optionally, prior to the deposition of the electrically conductive layer 122, a wet chemical surface treatment may be performed to remove any residual oxide on the layer of doped semiconductor material 120.

Figure 6:
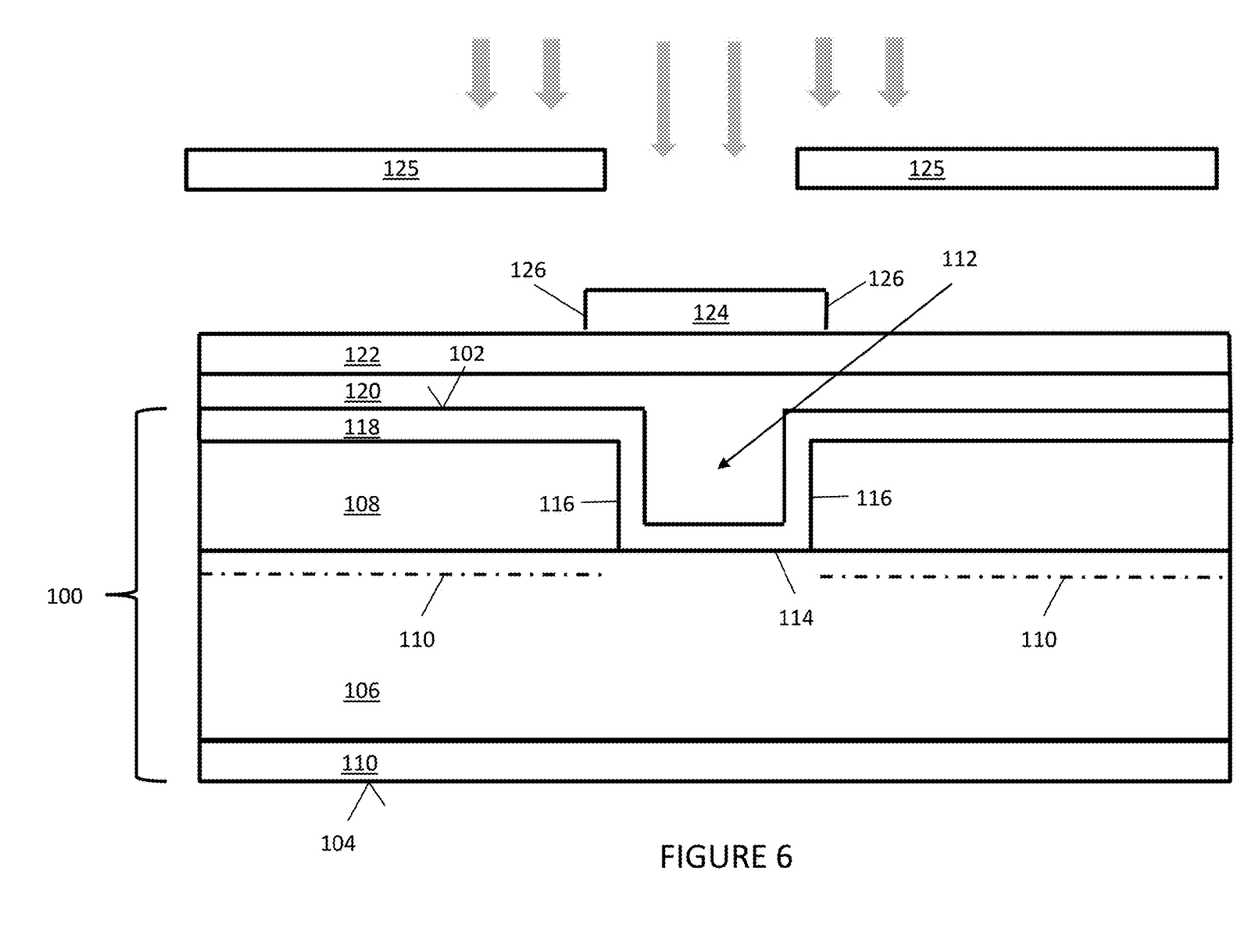
FIG. 6 illustrates forming a structured mask on the electrically conductive layer, according to an embodiment.

Referring to FIG. 6, a structured mask 124 is formed on the electrically conductive layer 122. The structured mask 124 is aligned with the gate trench 112 in such a way that the gate trench 112 is completely covered by the structured mask 124. That is, a center of the structured mask 124 is disposed directly over a center of the gate trench 112, and the structured mask 124 is at least as wide as the gate trench 112. According to an embodiment, the structured mask 124 is wider than the gate trench 112 such that there is at least some lateral overlap of the edges 126 of the structured mask 124 past the outer sidewalls 116 of the trench. The structured mask 124 can be formed using a commonly known photolithography technique. More particularly, a photomask 125 can be used to form both the gate trench 112 and the structured mask 124. In this way, the structured mask 124 is self-aligned with the gate trench 112.

Figure 7:
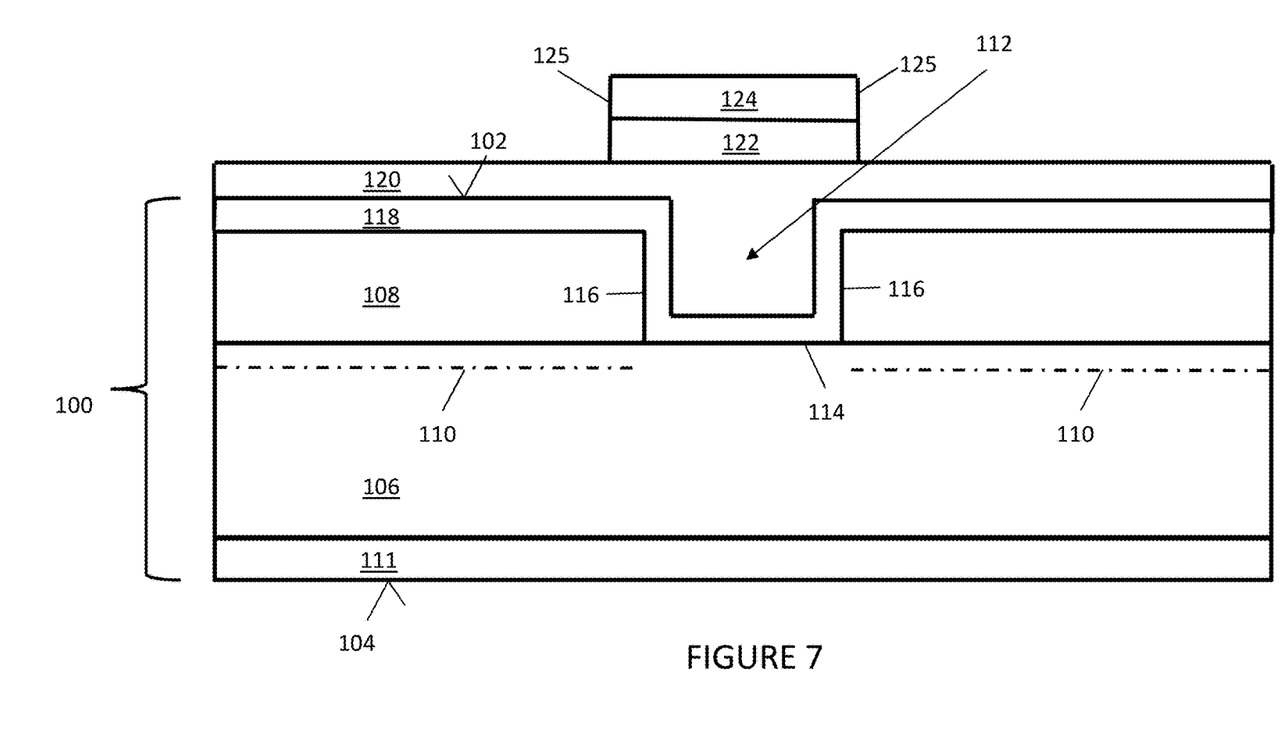
FIG. 7 illustrates removing exposed sections of the electrically conductive layer, according to an embodiment.
Figure 8:
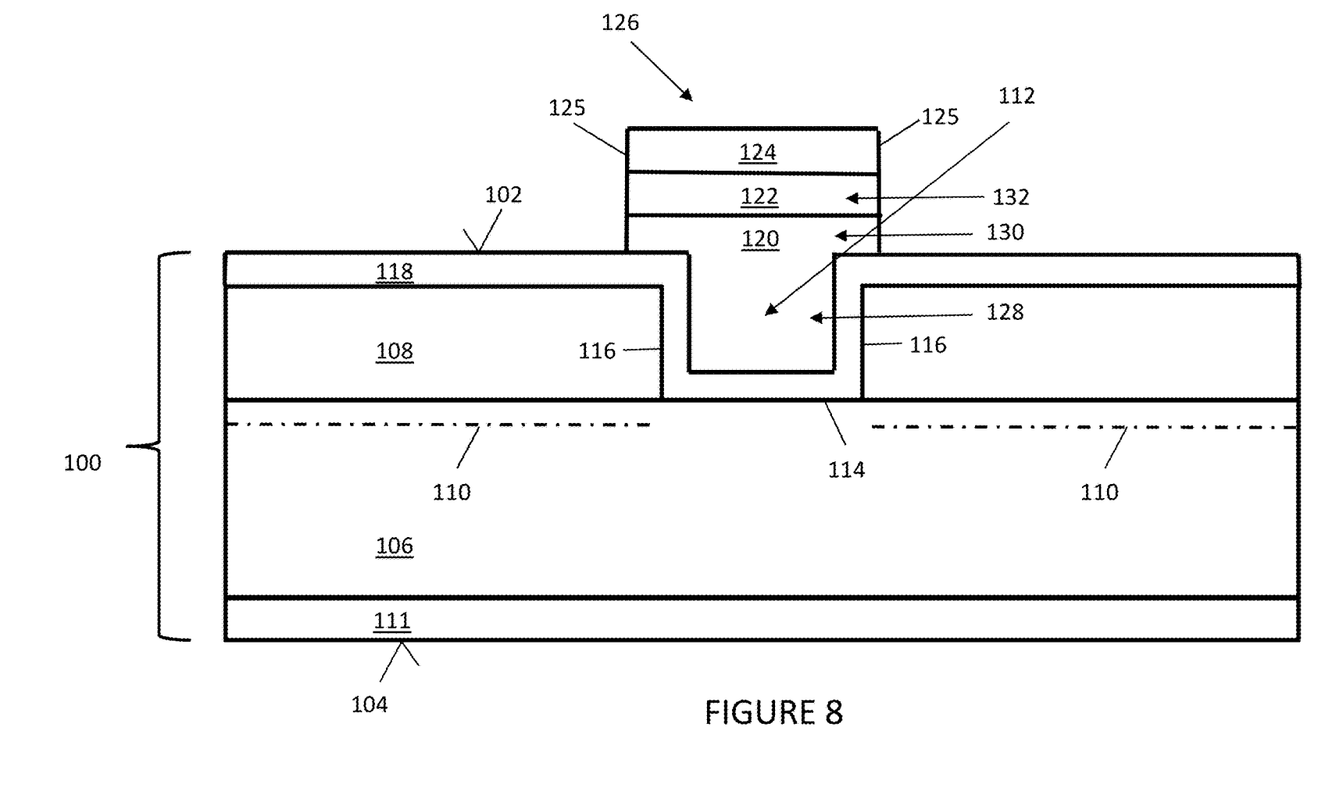
FIG. 8 illustrates removing exposed sections of the doped semiconductor layer, according to an embodiment.

Referring to FIGS. 7 and 8, sections of the layer of doped semiconductor material 120 and the electrically conductive layer 122 that are exposed from the structured mask 124 are removed. According to an embodiment, this is done by a two-step etching process. A first step of this two-step etching process is depicted in FIG. 7. In this step, the electrically conductive material of the electrically conductive layer 122 is etched selective to the doped semiconductor material of the layer of doped semiconductor material 120. This can be done using a fluorine based plasma treatment, for example. A second step of this two-step etching process is depicted in FIG. 8. In this step, the material of the layer of doped semiconductor material 120 is etched selective to the material of the barrier region 108. This can be done using a using a chlorine based plasma treatment that additionally includes oxygen or fluorine, for example.

The above described structuring techniques provide a gate structure 126 that includes a narrower portion 128 of the doped semiconductor material that is disposed in the gate trench 112, a wider portion 130 of the doped semiconductor material that is above the gate trench 112, and laterally extends past outer sidewalls 116 of the gate trench 112, and a gate electrode portion 132 that is formed by electrically conductive material. The gate electrode portion 132 completely covers the wider portion 130 of the doped semiconductor material. That is, the gate electrode portion 132 extends along an entire upper surface of the doped semiconductor material.

Figure 9:
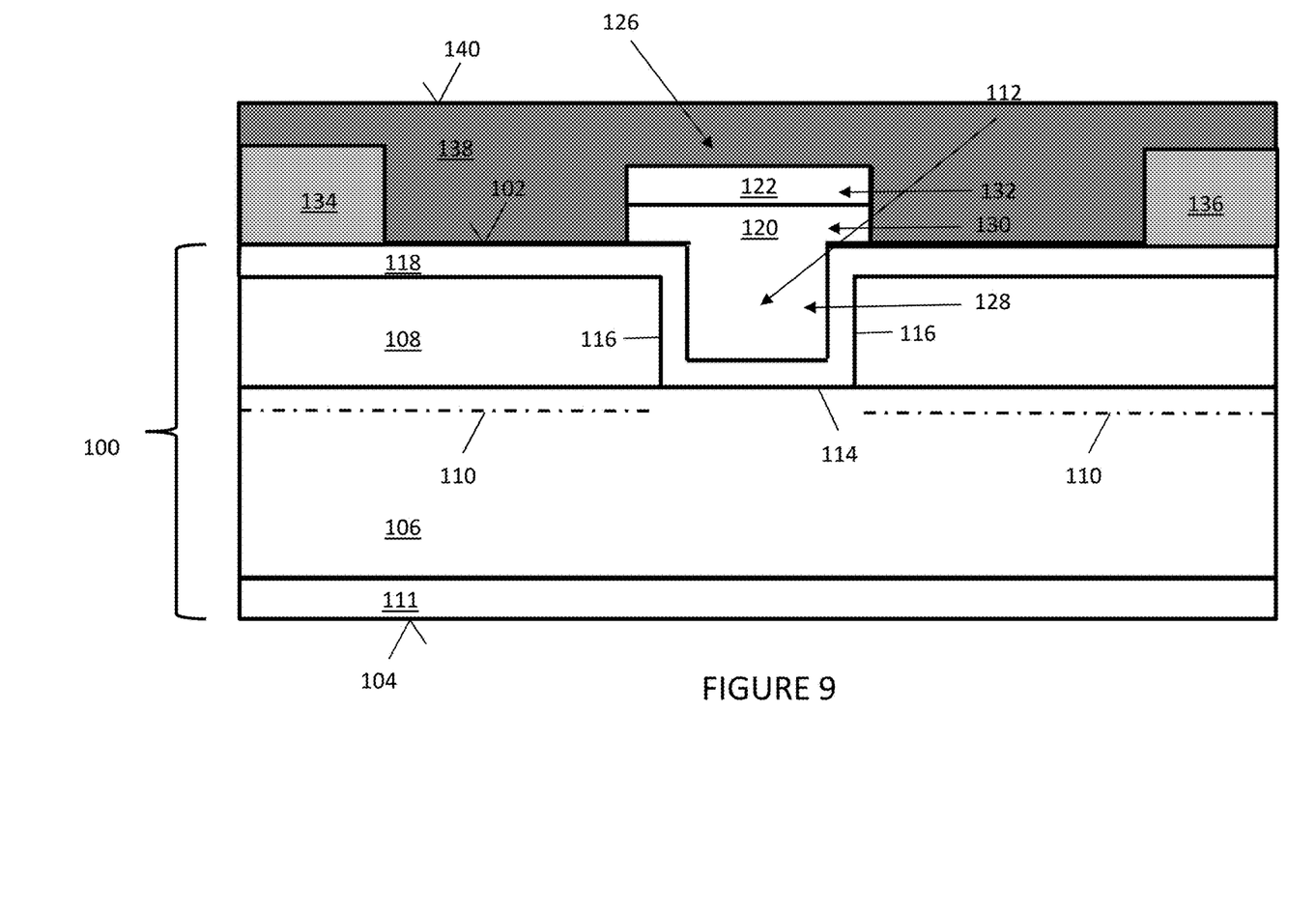
FIG. 9 illustrates forming source and drain electrodes and a passivation layer on the heterostructure body, according to an embodiment.

Referring to FIG. 9, further processing steps are performed. First, the structured mask 124 is removed. This may be done by commonly known photoresist stripping techniques. Subsequently, a wet chemical cleaning process can be performed to remove any residual oxide. Subsequently, electrically conductive source and drain electrodes 134, 136 are formed on the heterostructure body 100. The source and drain electrodes 134, 136 can be formed from any of a variety of electrically conductive metals, such as Ti, TiN, W, TiW and Mo, for example. The source and drain electrodes 134, 136 ohmically contact the two-dimensional charge carrier gas channel 110. According to one embodiment, the source and drain electrodes 134, 136 extend completely through the barrier region 108 and physically contact the two-dimensional charge carrier gas channel 110. However, physical contact is not necessary and the source and drain electrodes 134, 136 may alternatively be spaced apart from the two-dimensional charge carrier gas channel 110 but nonetheless be in ohmic connection with the channel of the device. The source and drain electrodes 134, 136 can be formed by can be formed by a deposition technique, such as a physical vapor deposition (PVD) technique.

A passivation layer 138 is formed on the heterostructure body 100. Generally speaking, the passivation layer 138 can include any material that electrically insulates and protects the surface of the heterostructure body 100. Examples of these materials include semiconductor nitrides, semiconductor oxides, and semiconductor oxynitrides such as silicon nitride (SiN), silicon dioxide ($SiO_2$), and silicon oxynitride ($SiO_xN_y$). The passivation layer 138 can be formed by a deposition technique such as a plasma enhanced chemical vapor deposition (PECVD) technique. The passivation layer 138 can be formed on a portion of the semiconductor device that includes the gate structure 126 such that the passivation layer 138 completely covers the gate electrode portion 132. That is, from the cross-sectional perspective of FIG. 9, the passivation layer 138 extends over an entire upper surface of the gate electrode portion 132. Electrical contact to the gate electrode portion 132 (e.g., via conductive plugs) can be effectuated in other cross-sectional regions (not shown).

According to an embodiment, after the passivation layer 138 is formed, an upper surface 140 of the passivation layer 138 is planarized. This may be done by a chemical-mechanical planarization (CMP) technique, for example. As a result, the upper surface 140 of the semiconductor device extends along a single plane. Moreover, this plane is parallel to the main and rear surfaces 102, 104 of the heterostructure body 100.

In a commonly known manner, the gate structure 126 is configured to control a conductive state of two-dimensional charge carrier gas channel 110. ON/OFF control is achieved by suitable biasing of the gate electrode portion 132. The presence of the doped semiconductor material in the gate structure 126 modifies the intrinsically conductive state of the two-dimensional charge carrier gas channel 110 such that a conductive connection between the source and drain electrodes 134, 136 does not exist when gate electrode portion 132 is unbiased. The gate structure 126 is configured to turn the device ON with a sufficient voltage ($V_{TH}$) applied to the gate electrode that removes the depleted region of the two-dimensional charge carrier gas underneath the gate structure 126. As a result, the two-dimensional charge carrier gas channel 110 forms a conductive connection between the source and drain electrodes 134, 136.

Figure 10:
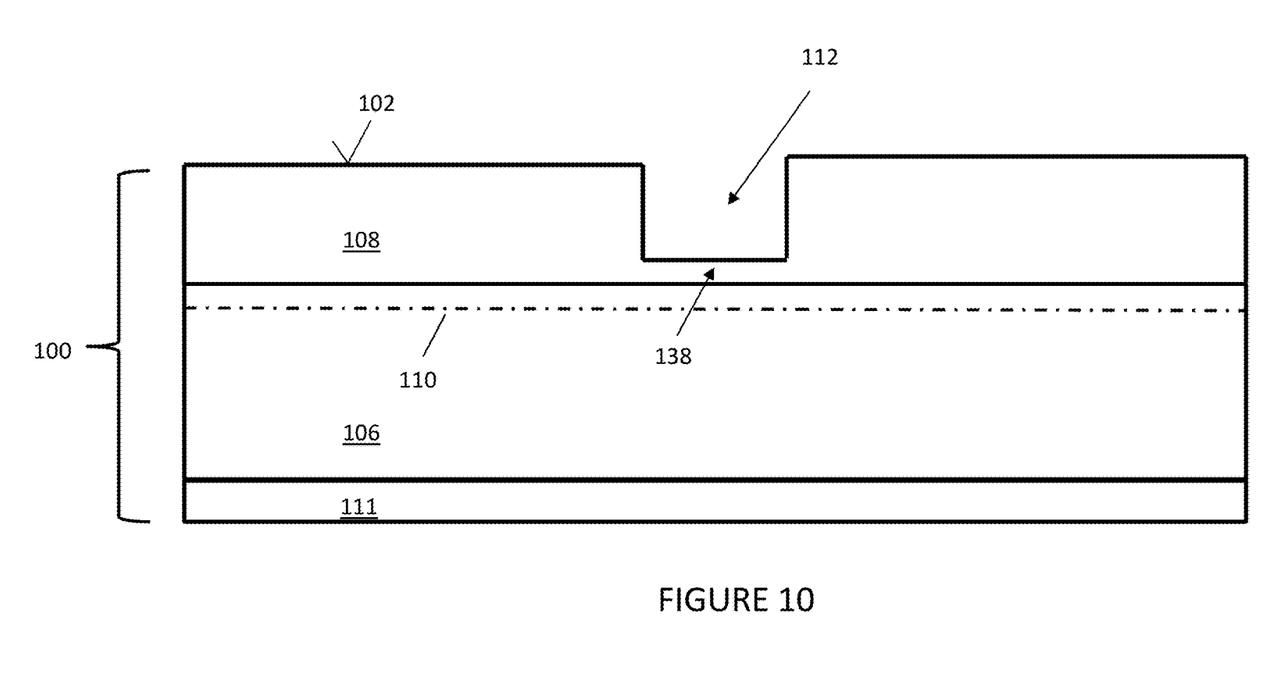
FIG. 10 illustrates forming a gate trench in the heterostructure body, according to another embodiment.
Figure 11:
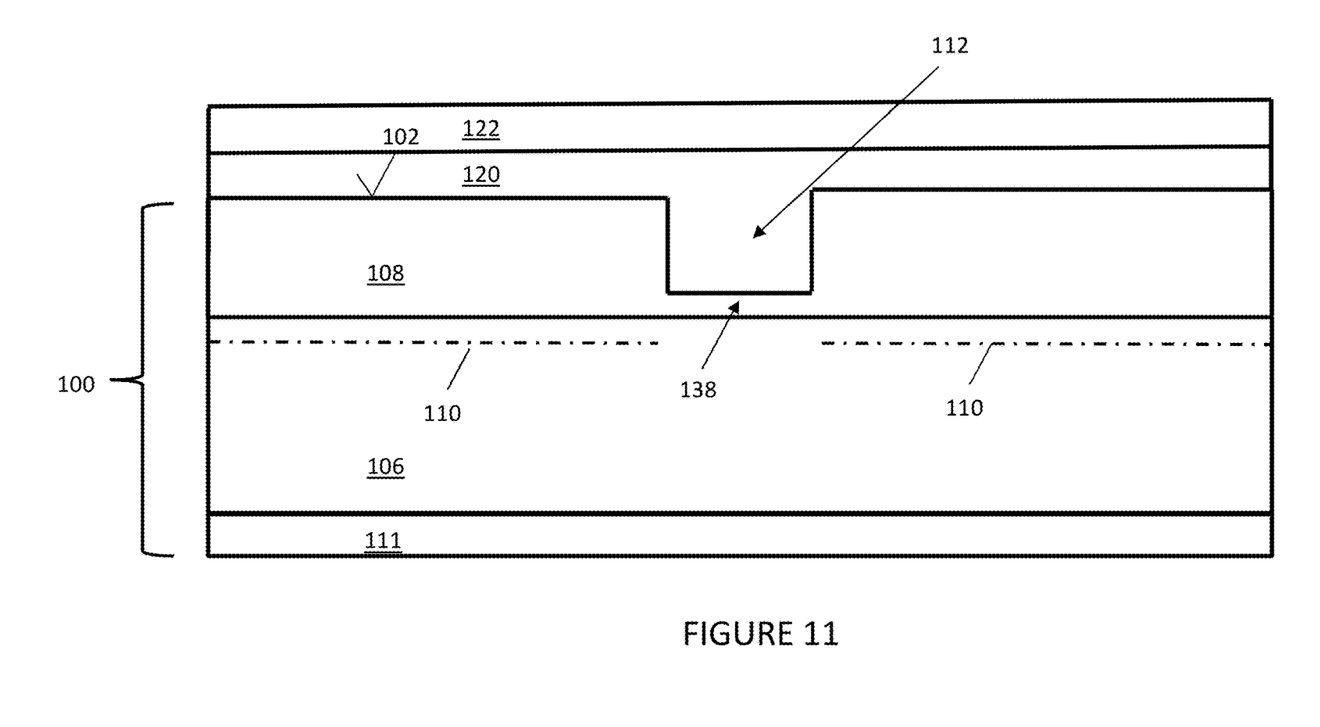
FIG. 11 illustrates forming a doped semiconductor layer and an electrically conductive layer on the heterostructure body of FIG. 10, according to another embodiment.
Figure 12:
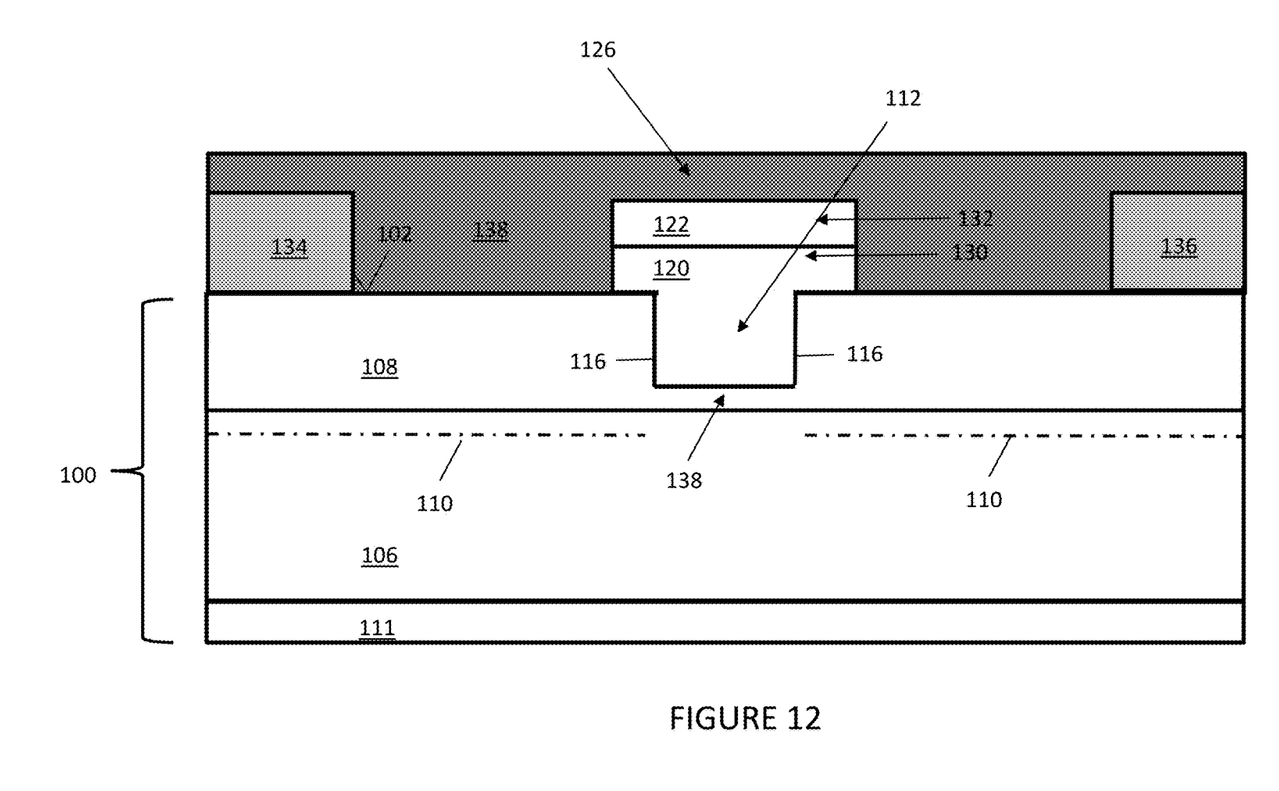
FIG. 12 illustrates forming source and drain electrodes and a passivation layer on the heterostructure body of FIG. 11, according to an embodiment.

FIGS. 10, 11 and 12 depict selected method steps for forming the semiconductor device, according to another embodiment. Those method steps that are not discussed with reference to FIGS. 10, 11 and 12 may be substantially similar or identical the previous method steps described with reference to FIGS. 1-9.

Referring to FIG. 10, a heterostructure body 100 is provided and a gate trench 112 is formed in the heterostructure body 100. The heterostructure body 100 may be provided according to the technique described with reference to FIG. 1. Subsequently, a section of the barrier region 108 is only partially removed to form the gate trench 112. As a result, a portion 138 of the barrier region 108 remains between a bottom 114 of the gate trench 112 and the barrier region 108. That is, the gate trench 112 formation process does not expose the buffer region 106. This is different to the technique described with reference to FIG. 2 in which the barrier region 108 is completely removed in a lateral section to expose the buffer region 106 at the bottom 114 of the gate trench 112. According to an embodiment, the gate trench 112 is formed by a time-controlled anisotropic plasma-etching process that is controlled to stop etching before reaching the buffer region 106. This process can be controlled such that the thickness of the remaining portion of the barrier region 108 at the bottom 114 of the gate trench 112 is approximately 5 to 20 nanometers (nm) thick, for example.

Referring to FIG. 11, a layer of doped semiconductor material 120 and an electrically conductive layer 122 are formed on the heterostructure body 100. The layer of doped semiconductor material 120 and the electrically conductive layer 122 can each be formed according to the techniques described with reference to FIGS. 4 and 5, respectively, and can each have the material composition of these layers as previously described. Different to the previous embodiment, the layer of doped semiconductor material 120 is formed directly on the surface of the buffer region 106.

Referring to FIG. 12, source and drain electrodes 134, 136 and the passivation layer 138 are formed. These features may be formed according to the techniques described with reference to FIG. 9. As a result, a semiconductor device that is configured to control the conductive state of the two-dimensional charge carrier gas channel 110. Different to the embodiment of FIG. 9, there is no second barrier layer 118 interposed between the layer of doped semiconductor material 120 and the buffer region 106.

The above described techniques produce a device with advantageous electrical characteristics. Because the gate structure 126 of the device described herein is formed by a self-aligned patterning technique wherein the doped semiconductor material and the gate electrode are structured using a common photomask 125, a minimal $L_{td}$ (lateral extension towards the drain) of the gate structure 126 can be achieved. The $L_{td}$ is measured between an outer sidewall 116 of the gate trench 112 that is closest to the drain electrode 136 and an outer edge of the doped semiconductor material in the wider portion 130. Because the present techniques can include a self-aligned technique whereby a common photomask 125 is used to form the gate trench 112 and the structured mask 124 that is used to form the gate structure 126, $L_{td}$ values of 100 nm or less can be achieved. By contrast, in a conventional technique, an overlapping gate structure 126 for an HEMT device is formed by a process that includes filling the trench with a doped semiconductor layer, subsequently structuring the doped semiconductor layer, subsequently depositing a passivation layer, subsequently etching a trench in the passivation layer, and subsequently depositing a gate metal in the trench of the passivation layer. That is, in the conventional technique, the gate metal is formed after structuring the doped semiconductor layer and forming the passivation layer. Due to the processing tolerances of this technique, a margin between the edge of the gate via and the edge of the doped semiconductor region is required. As a result, an $L_{td}$ value of 300 nm is impossible to achieve with this technique. By substantially reducing the $L_{td}$ value using the presently disclosed techniques, $C_{GD}$ (gate-drain capacitance) is correspondingly reduced. Consequently, a dramatic improvement in parasitic capacitance, an improved figure of merit (FOM), lower $R_{DSON}$ and reduced switching losses are achieved in comparison to the conventionally formed device.

An additional benefit to the electrical characteristics is achieved by the above described techniques by forming the gate structure 126 without exposing the bottom 114 of the gate trench 112 to damaging etchant (e.g., plasma etchant). According to a conventional technique, a plasma etch is performed after filling the gate trench 112 with doped semiconductor material. The doped semiconductor material is etched in such a way that the etchant reaches the bottom 114 of the gate trench 112. This results in damage to the semiconductor material at the bottom 114 of the gate trench 112. By eliminating this surface damage using the presently disclosed techniques, current collapse, dynamic $R_{DSON}$, and threshold voltage shift under pulsed conditions are expected to be significantly reduced.

In addition, the above described technique produces a device with advantageous physical characteristics. Because the doped semiconductor and the gate conductor are first structured and the passivation layer 138 is subsequently deposited, the outer surface of the passivation layer 138 corresponds to the uppermost surface of the device. The passivation layer 138 can be planarized to form a device with a low vertical profile, and an upper surface that extends along a single plane. By way of comparison, in a conventional device that is formed by structuring the doped semiconductor, subsequently depositing a passivation layer 138, etching a trench in the passivation layer 138, and depositing a gate metal in the trench of the passivation layer 138, the vertical profile of the device is increased and the uppermost surface of the device is multi-tiered. The resultant structure includes gate metal protruding out of the passivation layer 138 and planarization is therefore not possible. Thus, the device described herein has a simplified structure that is easier to incorporate into a semiconductor package.

In addition, the above described techniques have reduced process complexity and expense in comparison to conventional techniques. For example, the presently described technique forms the gate structure 126 using a self-aligned technique in which the gate trench 112 and the structured mask 124 are formed using a common photomask. The structured mask 124 is used to etch both the doped semiconductor material and the gate conductor. By way of comparison, conventional techniques typically include separate masking and etching steps for structuring both the doped semiconductor material portion and the electrode portion of the gate electrode.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel. For example, GaN may be combined with AlGaN or InGaN to form an electron gas inversion region as the channel. The compound semiconductor device may have AlInN/AlN/GaN barrier/spacer/buffer layer structures. In general, the normally-off compound semiconductor transistor can be realized using any suitable III-nitride technology such as GaN that permits the formation of opposite polarity inversion regions due to piezoelectric effects.

Specifically with regard to GaN technology, the presence of polarization charges and strain effects in a GaN-based heterostructure body due to piezoelectric effects yield a two-dimensional charge carrier gas in the heterostructure body characterized by very high carrier density and carrier mobility. Such a two-dimensional charge carrier gas, such as a 2DEG (two-dimensional electron gas) or 2DHG (two-dimensional hole gas), forms the conductive channel of the HEMT near the interface between, e.g., a GaN alloy barrier region and a GaN buffer region. A thin, e.g. 1-2 nm, AlN layer can be provided between the GaN buffer region and the GaN alloy barrier region to minimize alloy scattering and enhance 2DEG mobility. In a broad sense, the compound semiconductor transistors described herein can be formed from any binary, ternary or quaternary III-nitride compound semiconductor material where piezoelectric effects are responsible for the device concept.

In the figures provided herein, doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of forming a semiconductor device, the method comprising:
    providing a heterostructure body with a buffer region, and a barrier region disposed on the buffer region, the barrier region having a different band gap than the buffer region such that a two-dimensional charge carrier gas channel arises near an interface between the buffer region and the barrier region;
    forming a gate trench in the barrier region;
    forming a layer of doped semiconductor material that fills the gate trench, the doped semiconductor material in the gate trench locally depleting a subjacent section of the two-dimensional charge carrier gas channel at zero bias;
    forming a layer of electrically conductive material on the doped semiconductor material;
    structuring the layer of doped semiconductor material to form a gate structure that is configured to control a conductive state of the two-dimensional charge carrier gas channel, the gate structure comprising:
    a narrower portion of the doped semiconductor material that is disposed in the gate trench;
    a wider portion of the doped semiconductor material that is above the gate trench and laterally extends past outer sidewalls of the gate trench; and
    a gate electrode portion of the electrically conductive material that completely covers the wider portion of the doped semiconductor material,
    wherein forming a gate trench in the barrier region comprises etching the barrier region using a first photomask, wherein structuring the layer of doped semiconductor material to form a gate structure comprises forming a structured mask on the layer of doped semiconductor material over the gate trench, and wherein forming a structured mask comprises using the first photomask.

2. The method of claim 1, wherein forming the layer of doped semiconductor material comprises epitaxially growing the layer of doped semiconductor material on an exposed outer surface of the barrier region that includes the gate trench, and wherein forming the layer of electrically conductive material comprises depositing the electrically conductive material directly on the layer of doped semiconductor material.

3. The method of claim 2, further comprising:
    removing sections of the layer of doped semiconductor material and the layer of electrically conductive material that are exposed from the structured mask.

4. The method of claim 3, wherein removing the sections of the layer of doped semiconductor material and the layer of electrically conductive material comprises a two-step etching process, the two-step etching process comprising:
    etching the electrically conductive material selective to the doped semiconductor material; and subsequently etching the doped semiconductor material selective to material of the barrier region.

5. The method of claim 3, further comprising:
removing the structured mask after removing the sections of the layer of doped semiconductor material and the layer of electrically conductive material; and
forming an electrically insulating passivation layer on the heterostructure body after removing the structured mask.

6. The method of claim 5, wherein forming the electrically insulating passivation layer comprises depositing the electrically insulating passivation layer on a portion of the semiconductor device that includes the gate structure such that the passivation layer completely covers the gate electrode portion.

7. The method of claim 1, wherein forming the gate trench comprises etching a section of the barrier region completely away such that the buffer region is exposed at a bottom of the gate trench, the method further comprising:
forming a second barrier layer that lines the bottom and sidewalls of the gate trench; and
forming the layer of doped semiconductor material on the second barrier layer such that the doped semiconductor material is separated from the buffer region by the second barrier layer.

8. The method of claim 1, wherein forming the gate trench comprises etching a section of the barrier region partially away such that a portion of the barrier region remains between a bottom of the gate trench and the barrier region, the method further comprising:
forming the layer of doped semiconductor material directly on the sidewalls and bottom of the gate trench.

9. The method of claim 1, further comprising:
forming electrically conductive source and drain electrodes on the heterostructure body, each of the source and drain electrodes being in ohmic contact with the two dimensional charge carrier gas channel,
wherein the wider portion of the doped semiconductor material laterally extends past an outer sidewall of the gate trench that is closest to the drain electrode by no more than 100 nm.

10. A method of forming a semiconductor device, the method comprising:
providing a heterostructure body with a buffer region, and a barrier region disposed on the buffer region, the barrier region having a different band gap than the buffer region such that a two-dimensional charge carrier gas channel arises near an interface between the buffer region and the barrier region;
forming a gate trench in the barrier region;
forming a layer of doped semiconductor material that completely fills the gate trench, the doped semiconductor material in the gate trench locally depleting the two-dimensional charge carrier gas channel at zero bias;
forming a layer of electrically conductive material on the doped semiconductor material;
structuring the layer of doped semiconductor material to form a gate structure that is configured to control a conductive state of the two-dimensional charge carrier gas channel; and
forming an electrically insulating passivation layer on the barrier region and the gate structure after structuring the layer of doped semiconductor material and the layer of electrically conductive material,
wherein forming a gate trench in the barrier region comprises etching the barrier region using a first photomask, wherein structuring the layer of doped semiconductor material to form a gate structure comprises forming a structured mask on the layer of doped semiconductor material over the gate trench, and wherein forming a structured mask comprises using the first photomask.

11. The method of claim 10, wherein forming the layer of doped semiconductor material comprises epitaxially growing the layer of doped semiconductor material on an exposed outer surface of the barrier region that includes the gate trench, and wherein forming the layer of electrically conductive material comprises depositing the electrically conductive material directly on the layer of doped semiconductor material.

12. The method of claim 11, further comprising
removing sections of the layer of doped semiconductor material and the layer of electrically conductive material that are exposed from the structured mask such that the gate structure comprises:
a wider portion of the doped semiconductor material that is above the gate trench and laterally extends past outer sidewalls of the gate trench; and
a gate electrode portion of the electrically conductive material that completely covers the wider portion of the doped semiconductor material.

13. The method of claim 12, wherein removing the sections of the layer of doped semiconductor material and the layer of electrically conductive material comprises a two-step etching process, the two-step etching process comprising:
etching the electrically conductive material selective to the doped semiconductor material; and subsequently
etching the doped semiconductor material selective to material of the barrier region.

14. The method of claim 12, wherein forming the electrically insulating passivation layer comprises depositing the electrically insulating passivation layer on a portion of the semiconductor device that includes the gate structure such that the passivation layer completely covers the gate electrode portion.

15. The method of claim 12, further comprising:
forming electrically conductive source and drain electrodes on the heterostructure body, each of the source and drain electrodes being in ohmic contact with the two dimensional charge carrier gas channel,
wherein the wider portion of the doped semiconductor material laterally extends past an outer sidewall of the gate trench that is closest to the drain electrode by no more than 100 nm.

16. The method of claim 10, wherein forming the gate trench comprises etching a section of the barrier region completely away such that the buffer region is exposed at a bottom of the gate trench, the method further comprising:
forming a second barrier layer that lines the bottom and sidewalls of the gate trench; and
forming the layer of doped semiconductor material on the second barrier layer such that the doped semiconductor material is separated from the buffer region by the second barrier layer.

17. The method of claim 10, wherein forming the gate trench comprises etching a section of the barrier region partially away such that a portion of the barrier region remains between a bottom of the gate trench and the barrier region, the method further comprising:
forming the layer of doped semiconductor material directly on the sidewalls and bottom of the gate trench.

* * * * *